United States Patent
Smith (10) Patent No.: US 8,987,052 B2
(45) Date of Patent: Mar. 24, 2015

(54) ATTACHMENT OF MICROELECTRONIC COMPONENTS

(71) Applicant: Seagate Technology LLC, Cupertino, CA (US)

(72) Inventor: Ralph Kevin Smith, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 28 days.

(21) Appl. No.: 13/755,409

(22) Filed: Jan. 31, 2013

(65) Prior Publication Data

US 2014/0210110 A1 Jul. 31, 2014

(51) Int. Cl.
*H01L 21/00* (2006.01)
*H01L 23/00* (2006.01)

(52) U.S. Cl.
CPC ............ *H01L 24/32* (2013.01); *H01L 24/83* (2013.01); *H01L 2924/12041* (2013.01)
USPC ........... 438/107; 257/782; 257/686; 257/777; 438/118; 438/119

(58) Field of Classification Search
CPC ........... H01L 2224/81359; H01L 2224/81399; H01L 2224/81801; H01L 2224/16501; H01L 2224/83801; H01L 2224/29099; H01L 2224/29; H01L 2224/4824
USPC .......... 257/686, 777, 779, 782, 783; 438/107, 438/109, 110, 118, 119
See application file for complete search history.

(56) References Cited

U.S. PATENT DOCUMENTS

| | | | |
|---|---|---|---|
| 3,808,670 A * | 5/1974 | Seetoo et al. | 228/123.1 |
| 6,991,855 B2 * | 1/2006 | Weihs et al. | 428/607 |
| 8,074,869 B2 | 12/2011 | Lyons et al. | |
| 2001/0046597 A1 | 11/2001 | Weihs et al. | |
| 2004/0001420 A1 | 1/2004 | Challener | |
| 2004/0149373 A1 | 8/2004 | Weihs et al. | |
| 2007/0231960 A1 * | 10/2007 | Pavier et al. | 438/106 |
| 2009/0078470 A1 | 3/2009 | Lyons et al. | |
| 2011/0089462 A1 * | 4/2011 | Van Heerden et al. | 257/99 |
| 2011/0127314 A1 * | 6/2011 | Heinrich et al. | 228/123.1 |
| 2011/0284975 A1 * | 11/2011 | Braeuer et al. | 257/415 |
| 2013/0252039 A1 * | 9/2013 | Vom Dorp et al. | 429/61 |

OTHER PUBLICATIONS

Morris et al., "Rapid initiation of reactions in Al/Ni multilayers with nanoscale layering", Abstract, Journal of Physics and Chemistry of Solids, vol. 71, Issue 2, Feb. 2010, http://www.sciencedirect.com/science/article/pii/S002236970900198X.

Major, Jon, Indium Corporation website—Standard NonoFoil sheets made by Indium Corporation, http://www.indium.com/nanofoil/sheets/, printed Jan. 29, 2013, 3 pages.

* cited by examiner

*Primary Examiner* — S. V. Clark
(74) *Attorney, Agent, or Firm* — HolzerIPLaw, PC (57) ABSTRACT

Sub-micron precision alignment between two microelectronic components can be achieved by applying energy to incite an exothermic reaction in alternating thin film reactive layers between the two microelectronic components. Such a reaction rapidly distributes localized heat to melt a solder layer and form a joint without significant shifting of components.

20 Claims, 10 Drawing Sheets

ATTACHMENT OF MICROELECTRONIC COMPONENTS

BACKGROUND

In some applications, microelectronic components are aligned with sub-micron precision. However, such precision alignment can be disturbed during an attachment process when heat is applied to solder between the microelectronic components. In particular, the high temperatures associated with traditional soldering lead to thermal expansion of components, which can cause shifting during solder reflow. In addition, some microelectronic components are heat-sensitive and may be damaged if subjected directly to the high temperatures necessary to melt the solder.

SUMMARY

In one implementation, a joint is rapidly created between two microelectronic components by an exothermic reaction. The heat from the exothermic reaction is localized as compared to traditional soldering so that the effects of thermal expansion are mitigated or not observed. Thus, there is very minimal shifting between the microelectronic components. In at least one implementation, alignment between the two components can be achieved with less than 1 µm of tolerance.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

DETAILED DESCRIPTION

"Heat assisted magnetic recording," optical assisted recording or thermal assisted recording (collectively hereinafter HAMR) generally refers to the concept of locally heating a recording medium to reduce the coercivity of the recording medium so that an applied magnetic write field can more easily affect magnetization of the recording medium during a temporary magnetic softening of the recording medium caused by the local heating.

To perform HAMR, heat or a light source is applied to a magnetic medium and confined to a bit location where writing is taking place. Typically, a laser beam is propagated through a waveguide and focused by a focusing element such as a planar solid immersion mirror into a near-field transducer. However, this requires a precision alignment between the waveguide and the laser.

The implementations disclosed herein provide for attachment of microelectronic components such as a laser and a waveguide, with precision alignment. This attachment is accomplished by applying energy to incite an exothermic reaction between alternating reactive thin film layers positioned between two microelectronic components. The reaction rapidly distributes localized heat to melt a solder layer and to form a joint. Because the heat is localized, heat sensitive components (e.g., the laser) are not at risk and may remain active during the alignment process. Moreover, the heating and cooling of the solder happens so rapidly that thermal expansion does not cause significant shifting between the components.

As used herein, the term "microelectronic" refers to small electronics made of semi-conductor materials that are typically measured on the micrometer-scale or smaller. This class of electronics also includes micro electro-optical components such as those common in HAMR devices.

Figure 1:
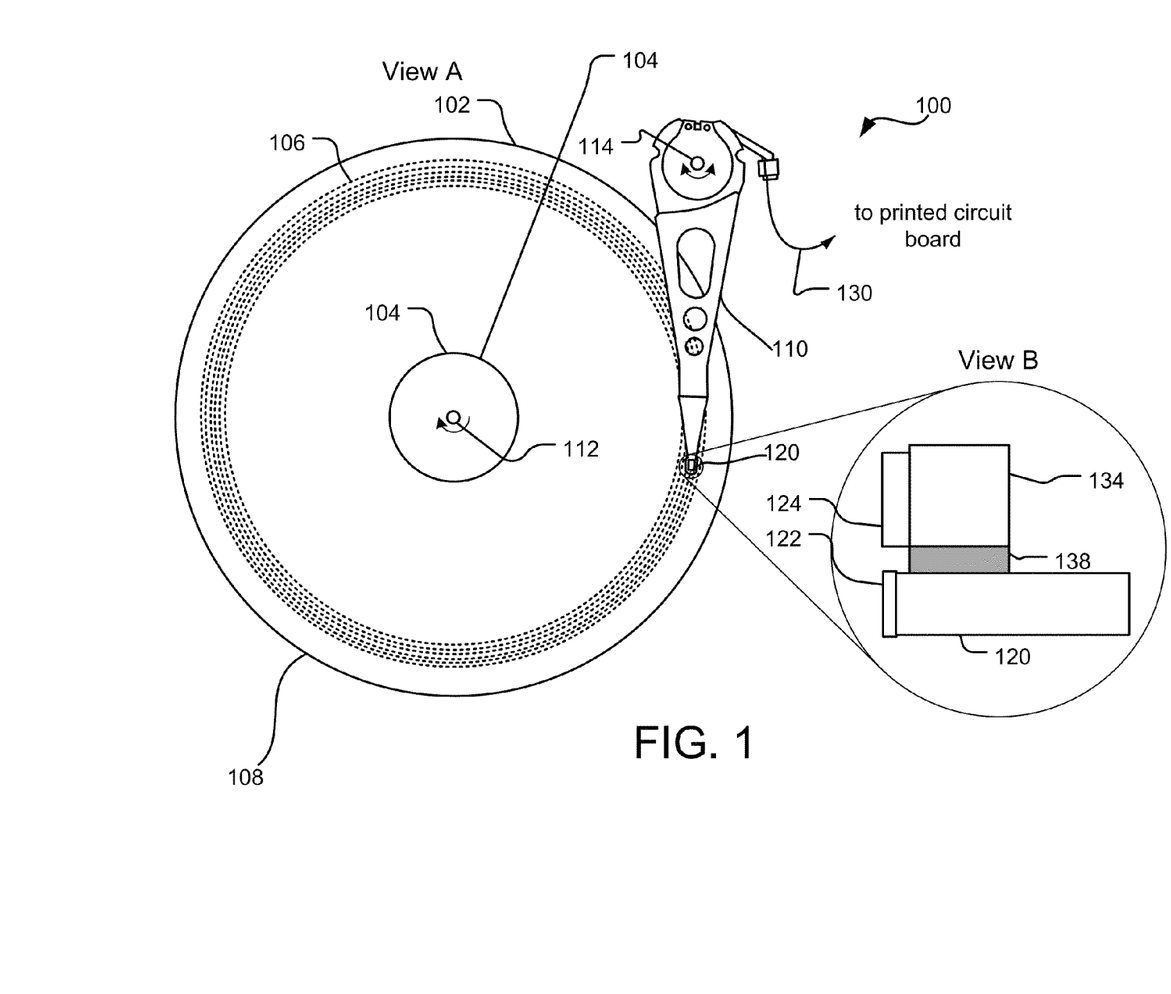
FIG. 1 illustrates a plan view of an example disc drive assembly including a transducer on a distal end of an actuator arm positioned over a media disc.

FIG. 1 illustrates a plan view of an example disc drive assembly 100 including a slider 120, an example microelectronic component, on a distal end of an actuator arm 110 positioned over a media disc 108. A rotary voice coil motor that rotates about actuator axis of rotation 114 is typically used to position the slider 120 on a data track and a spindle motor that rotates about disc axis of rotation 112 is used to rotate the media. Referring specifically to View A, the media 108 includes an outer diameter 102 and inner diameter 104 between which are a number of data tracks 106 (e.g., data track 140), illustrated by circular dotted lines.

Information may be written to and read from the data tracks on the media 108 through the use of the actuator arm 110. The actuator arm 110 rotates about an actuator axis of rotation 114 during a seek operation to locate a desired data track on the media 108. The actuator arm 110 extends toward the media 108, and at the distal end of the actuator arm 110 is the slider 120, which flies in close proximity above the media 108 while reading and writing data to the media 108. In other implementations, there is more than one slider 120, actuator arm 110, and/or media 108 in the disc drive assembly 100.

A flex cable 130 provides the requisite electrical connection paths for the slider 120 while allowing pivotal movement of the actuator arm 110 during operation. The flex assembly 130 also provides power for an on-slider laser light source.

The slider 120 shown in View B of FIG. 1 is attached to a laser submount assembly having a laser light source 124 (e.g., a laser diode) or other light source (e.g., a light emitting diode (LED)). The laser submount assembly 134 is joined to the slider 120 at an alloyed joint 138. In one implementation, the alloyed joint 138 is formed by inciting an exothermic reaction between two or more alternating thin film reactive multilayers according to the implementations disclosed herein.

The slider 120 includes a writer section (not shown) having a main write pole magnetically coupled to a return or opposing pole by a yoke or pedestal. A magnetization coil surrounds the yoke or pedestal to induct magnetic write pulses in the write pole. In other implementations, the slider 120 may be constructed without a yoke or return pole. The slider 120 also includes one or more read sensors (not shown) for reading data off of the media 108.

Light from the laser light source 124 is directed through a waveguide 122 on the trailing edge of the slider 120. Using the waveguide, the light is then redirected and/or focused on a point on the media 108 in close proximity to the write pole on the slider 120. A near-field transducer (NFT) may also be mounted on the slider 120 to further concentrate the light on the point on the media 108. In another implementation, one or more of the laser light source 124, waveguide 122, mirrors (not shown), and/or NFTs (not shown) are mounted on an area of the slider 120 other than the trailing surface.

Figure 2:
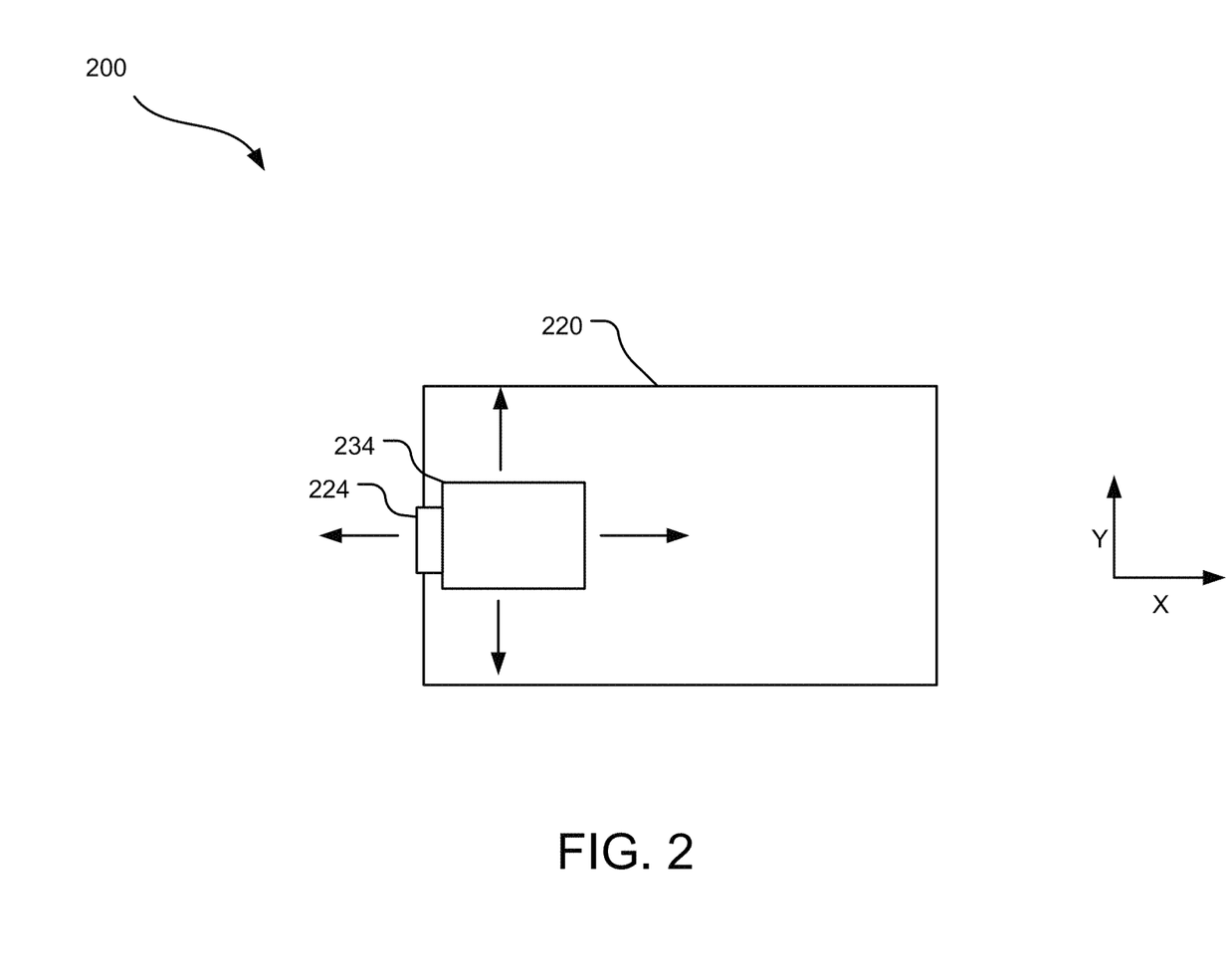
FIG. 2 illustrates a top view of an example active alignment technique for aligning a laser on a laser submount assembly with a waveguide on a trailing edge of a slider.

FIG. 2 illustrates a top view of an example active alignment technique for aligning a laser 224 on a laser submount assembly 234 with a waveguide (not shown) on a trailing edge of a slider 226. In one implementation, this alignment is performed as a step in an attachment and alignment process in which a joint is created as a result of an exothermic reaction between reactive multilayers. To align the laser 224 with the waveguide (not shown) on the slider 220, the laser is illuminated and then moved relative to the waveguide in either the X and/or Y direction, as illustrated by arrows in FIG. 2. While the laser 224 is moved along the X and/or Y axis, laser output passing through the waveguide (not shown) on the slider 220 is monitored to find the laser position corresponding to peak laser output. Once the point corresponding to the peak laser output is found, the laser submount assembly 234 is brought into contact with the slider 220 for attachment thereto. This may be accomplished, for example, by lowering the submount assembly 234 in the Z-direction without changing its X and Y position relative to the slider 220. In some implementations, an active alignment according to this or a similar process employs additional tooling not shown in FIG. 2.

The steps discussed below with respect to FIGS. 3-8 describe implementations of one or more methods for attaching a slider and a laser submount assembly for use in a HAMR recording head. However, the same or similar techniques may be utilized for attaching a variety of microelectronic components to attain sub-micron alignment precision.

Figure 3:
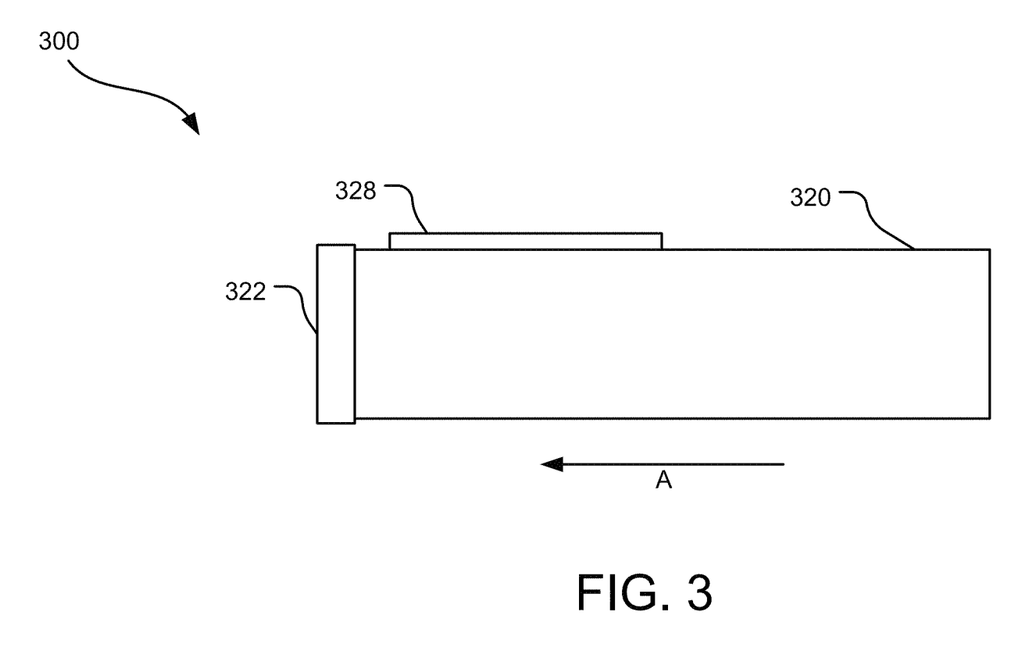
FIG. 3 illustrates a first layer deposition step in attaching a first microelectronic component to another microelectronic component according to one implementation.

FIG. 3 illustrates a first layer deposition step 300 in attaching a first microelectronic component (e.g., a slider 326) to another microelectronic component according to one implementation. A waveguide 322 is shown attached to a trailing edge of a slider 320. The slider has a write pole (not shown) adjacent to the waveguide 322, and the write pole is configured to write to a media disc when the slider 320 is positioned on the end of an actuator arm (not shown) in the disk drive assembly above a media disc that rotates below the slider 320 in the direction shown by the arrow 'A.'

In the first layer deposition step 300, a thin layer of solder 328 is deposited on the slider 320. In various implementations, the thickness of this layer may range between hundreds of microns to several nanometers. In one implementation, the solder layer 328 has a thickness that is substantially between 0.0004 and 0.003 mm. In an alternate implementation, the solder layer 328 may be deposited directly on a second microelectronic component, such as a laser submount assembly, rather than on the slider. In one implementation, the solder layer 328 is a gold solder pad that is affixed to a top side of the slider 320. The solder layer 328 may be evaporated onto the slider 320 or applied via any traditional deposition method. In a method utilizing evaporation, the solder is evaporated in a vacuum and condensed onto a substrate before the substrate is sliced into components for use in HAMR recording heads.

Figure 4:
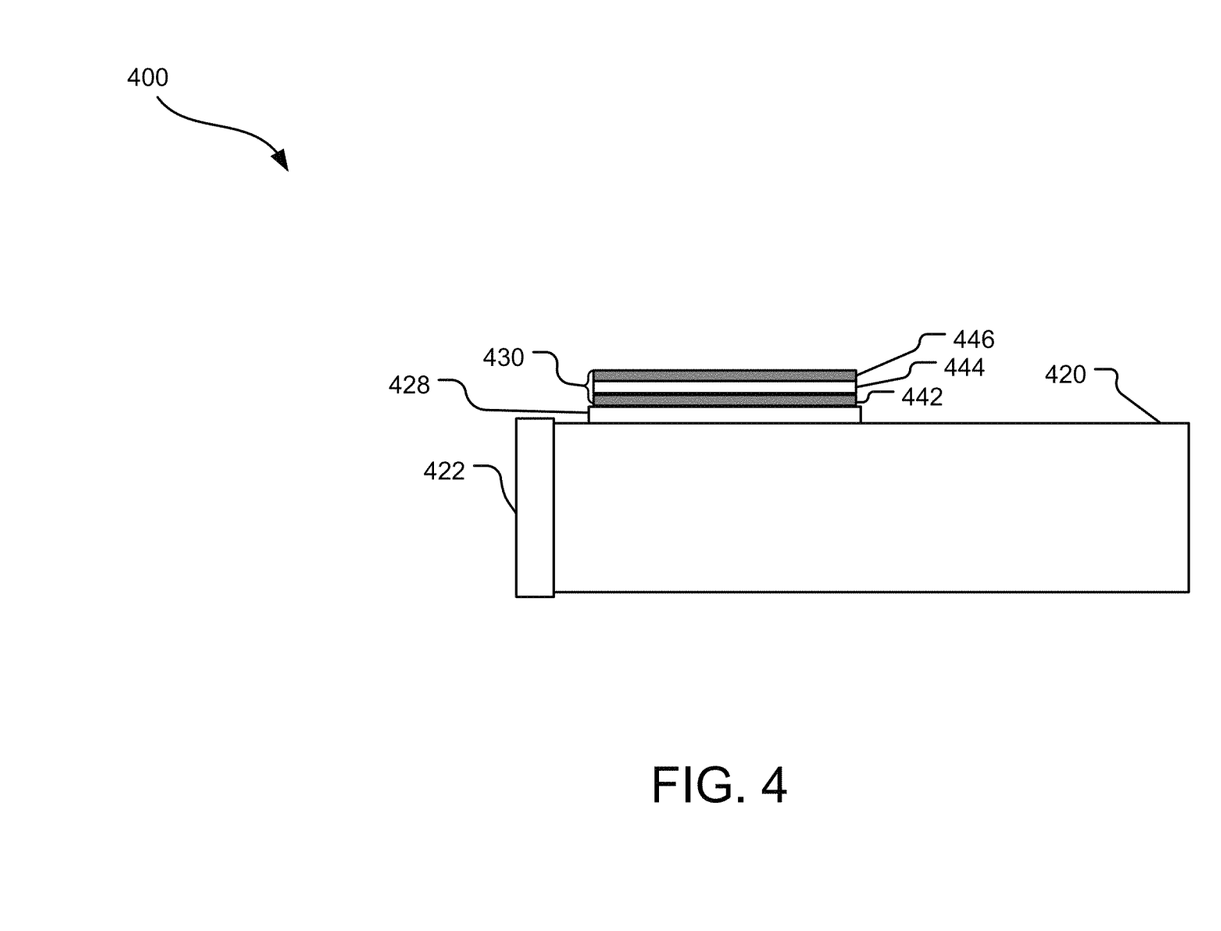
FIG. 4 illustrates another layer deposition step in attaching a first microelectronic component to a second microelectronic component according to one implementation.

FIG. 4 illustrates another layer deposition step 400 in attaching a first microelectronic component (e.g., a slider 426) to a second microelectronic component according to one implementation. In the layer deposition step 400, a lamellar structure 430 is formed on a solder layer 428. The lamellar structure 430 includes at least two alternating thin film reactive layers 442 and 444, which are alternating layers of exothermically reactive material. In one implementation, the alternating thin film reactive layers 442, 44, and 446 are alternating layers of aluminum and nickel; however, a variety of reactive materials may react similarly and be suitable for use in other implementations. For example, suitable combinations may include but are not limited to: titanium and aluminum; platinum and aluminum; palladium and aluminum; titanium and boron; and nickel and silicon.

The alternating thin film reactive layers may be applied by evaporation or any other traditional deposition method. In one implementation, the solder layer 428 and the lamellar structure 430 are formed on a wafer at a factory through a deposition process. The solder layer 428 is formed on the wafer; a first thin film reactive layer 442 is formed on the solder layer 428; the second thin film reactive layer 444 is formed on the first thin film reactive layer 442, etc. After all of the thin film reactive layers in the lamellar structure 430 are formed, the wafer is diced into several components for use in individual recording heads.

Although three alternating thin film reactive layers 430 are shown in FIG. 4, the number of thin film reactive layers required to practice an implementation of the invention may vary according to the specific materials chosen and other design criteria. Because the materials in the lamellar structure 430 are to react exothermically with each other when energy is applied, at least two of the alternating thin film reactive layers of exothermically reactive materials are preferably included. In one implementation, the alternating thin film reactive layers are of nickel and aluminum.

In one implementation, the alternating thin film reactive layers are formed by depositing a first layer of a first exothermically reactive materiel (e.g., either nickel or aluminum) 442 on the solder layer 428 and then depositing a first layer of a second exothermically reactive material (e.g., nickel if aluminum is the first reactive layer) 444 on the first layer of the first exothermically material 442. In the same or a different implementation, a second layer of the first reactive exothermically material 446 is formed on the first layer of the second exothermically reactive material 444. Other implementations may have any number of additional alternating reactive layers and/or more than two different exothermically reactive materials. The thickness of the alternating reactive layers may be within the nanometer range. In one implementation, one or more of the alternative reactive layers have a thickness substantially equal to 10 nm.

Figure 5:
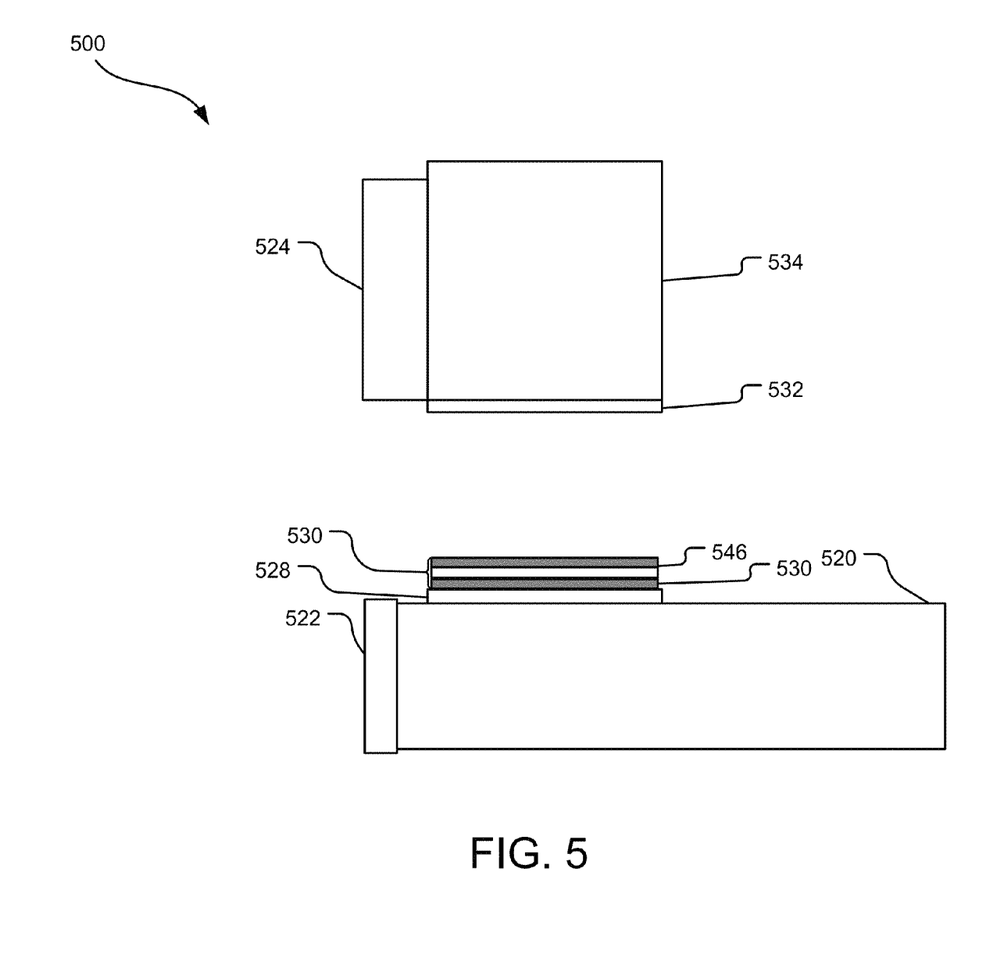
FIG. 5 illustrates another layer deposition step in attaching a first microelectronic component to a second microelectronic component according to one implementation.

FIG. 5 illustrates another layer deposition step 500 in attaching a first microelectronic component (e.g., a slider 520) to second microelectronic component (e.g., a laser submount assembly 534) according to one implementation. Prior to the layer deposition step 500, a first solder layer 528 was applied to the slider 520 by evaporation or other traditional deposition method, and a lamellar structure 530 including at least two alternating thin film reactive layers of alternating exothermically reactive materials was formed on the first solder layer 528. At the layer deposition step 500, a second solder layer 532 is applied to a laser submount assembly 534. In one implementation, the second solder layer 532 is applied through an evaporation process or other traditional deposition method.

Although the second solder layer 532 may be applied to the laser submount assembly (as illustrated in FIG. 5), it should be understood that the second solder layer 532 may alternatively be applied directly on top of the lamellar reactive multilayer stack 530 so that it is in contact with and adjacent to an outermost alternating thin film reactive layer 546. In another implementation, the alternating thin film reactive layers of the lamellar reactive stack 530 are formed on the second solder layer 532, which is formed on the laser submount assembly 534. In this implementation, the first solder layer 528 may be formed on the outer-facing side of the lamellar reactive stack 530 (i.e., the side facing away from the laser submount assembly 534) or, in the alternative, directly on the slider 520.

In yet another implementation, the first and second solder layers 528 and 532 are deposited on the slider 520 and the laser submount assembly 534, respectively (as illustrated in FIG. 5), and one or more alternating thin film reactive multilayers are formed on both of the first and second solder layers 528 and 532.

In one implementation, the solder layers 528 and 532 function to insulate the slider 520 and/or the laser submount assembly 534 from a corrosive material utilized in the alternating thin film reactive layers of the lamellar structure 530. For instance, certain materials such as aluminum may be damaging to microelectronic components if direct contact is made. Therefore, certain implementations—particularly those utilizing corrosive materials such as aluminum—may include two solder layers (e.g., the solder layers 528 and 532) as shown in FIG. 5. However, not all implementations of the invention disclosed herein utilize two layers of solder.

In some cases, a single solder layer may be used instead of the two solder layers 528 and 532. In one such implementation, the single solder layer is formed on one of the two microelectronic components (534 or 520) and the lamellar structure 530 is formed on the other of the two microelectronic components (520 or 534). Alternatively, a single solder layer may be formed on one of the two microelectronic components and the lamellar structure 530 may formed on the single solder layer. Here, a side of the lamellar structure 530 may, during attachment, directly contact one of the microelectronic components.

In yet another implementation, an adhesion layer is used in place of one or both of the solder layers 528, 532. Here, the adhesion layer functions as an insulator and includes a non-corrosive material such as titanium or titanium with nickel on top of it. In one such implementation, the adhesion layer is formed directly on one of two microelectronic components (e.g., the slider 526 or the laser submount assembly 534), and the lamellar structure 530 is formed on the adhesion layer. Here, a single layer of solder may be formed on the other one of the two microelectronic components or it may be formed on the lamellar structure 530 on a side that is opposite to a side in contact with the adhesion layer. In another implementation, the adhesion layer is formed directly on one of the two microelectronic components and the lamellar structure 530 is formed on a single solder layer on the other of the two microelectronic components.

In another implementation, no solder layers are used. For example, the alternating thin film reactive layers forming the lamellar structure 530 may be formed on one or both of the microelectronic components and the first and second microelectronic components may, during attachment, directly contact opposite sides of the lamellar structure 530. In one such implementation where no solder is used, non-corrosive reactive materials such as titanium and boron are used as the alternating thin film reactive layers. In another such implementation, nickel and silicon are used as the alternating thin film layers.

Figure 6:
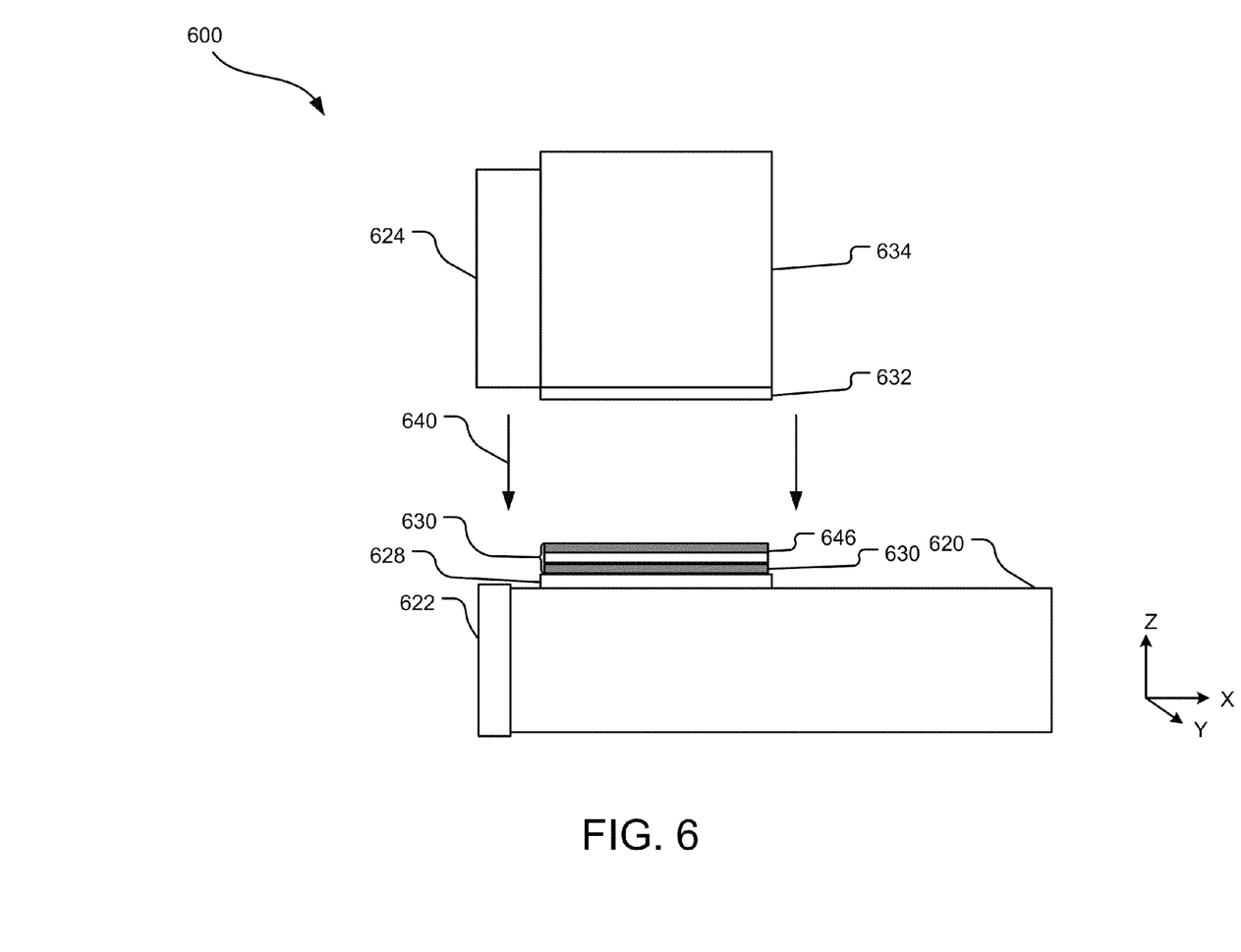
FIG. 6 illustrates an alignment step in attaching a first microelectronic component to second microelectronic component according to one implementation.

FIG. 6 illustrates an alignment step 600 in attaching a first microelectronic component (e.g., a slider 620) to second microelectronic component (e.g., a laser submount assembly 634) according to one implementation. At the alignment step 600, the slider 620 and laser submount assembly 634 are aligned for attachment in a manner that may be the same or similar to the active alignment steps described above with respect to FIG. 2. Specifically, a laser 624 on the laser submount assembly 634 is illuminated while the laser submount assembly 634 is moved in the X and Y directions to find a position of peak energy output of the laser 624 through a waveguide 622 on the slider 620. When this position is found, the laser submount assembly 634 is brought into contact with the slider 620 by lowering the laser submount assembly 634 through the Z plane (in the direction illustrated by arrow 640), without altering the X and Y alignment.

Alternatively, the alignment of the laser submount assembly 634 and the slider 620 may be performed while the laser submount assembly 634 is resting against the back of the slider 620. For example, the second solder layer 632 on the laser submount assembly 634 may be in contact with the lamellar structure 630 on the slider 620 while the laser submount assembly 634 is moved in the X and Y directions to find the point of peak energy output of the laser 622 through the waveguide 624.

Figure 7:
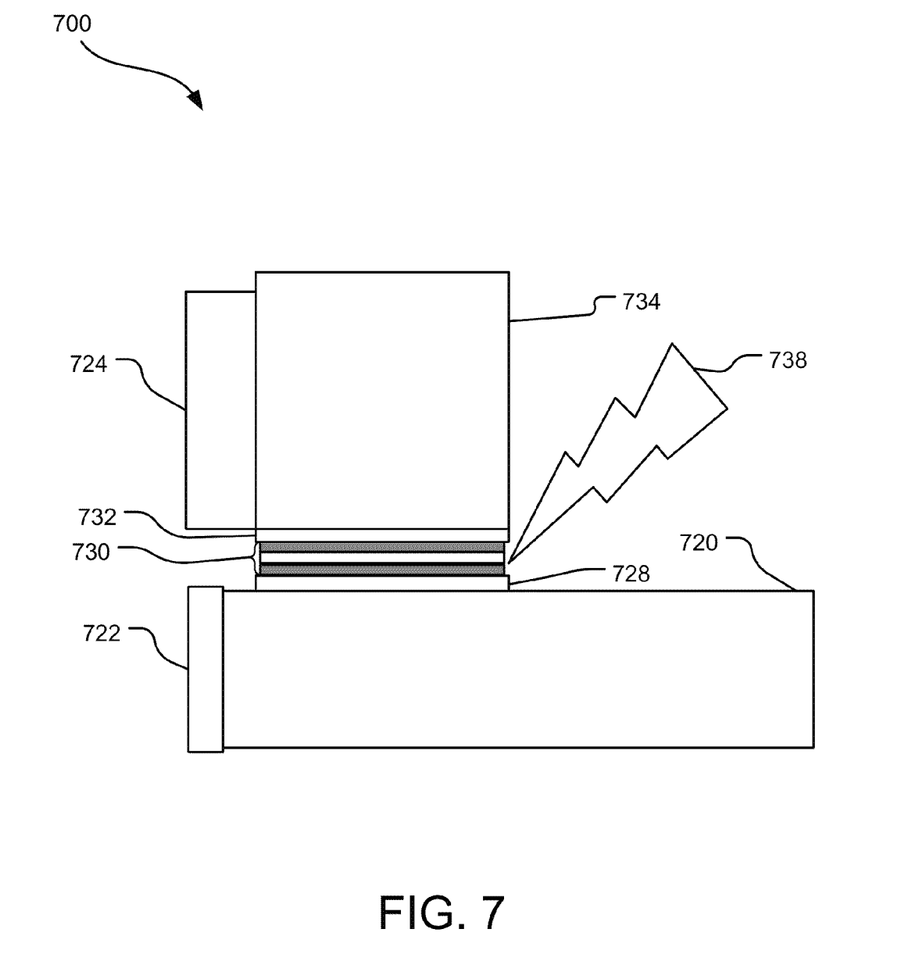
FIG. 7 illustrates an energy application step in attaching a first microelectronic component to a second microelectronic component according to one implementation.

FIG. 7 illustrates an energy application step 700 in attaching a first microelectronic component (e.g. a slider 726) to a second microelectronic component (e.g., a laser submount assembly 734) according to one implementation. Prior to the energy application step 700, a first solder layer 728 was formed on the slider 720 and a lamellar structure 730 consisting of alternating thin film reactive layers was formed on the first solder layer 728. A second solder layer 732 was applied to the laser submount assembly 734, and an active alignment was performed to align a laser 724 of the laser submount assembly 734 with a waveguide 722 of the slider 720.

At the energy application step 700, energy 738 is applied to the lamellar structure 730 to incite an exothermic reaction between the alternating thin film reactive layers. The energy 738 may be applied in a number of ways such as by laser, compression of the multilayer structure, a spark emission, etc. In at least one implementation, the energy 738 need only be applied for a short amount of time, such as a fraction of a second.

Figure 8:
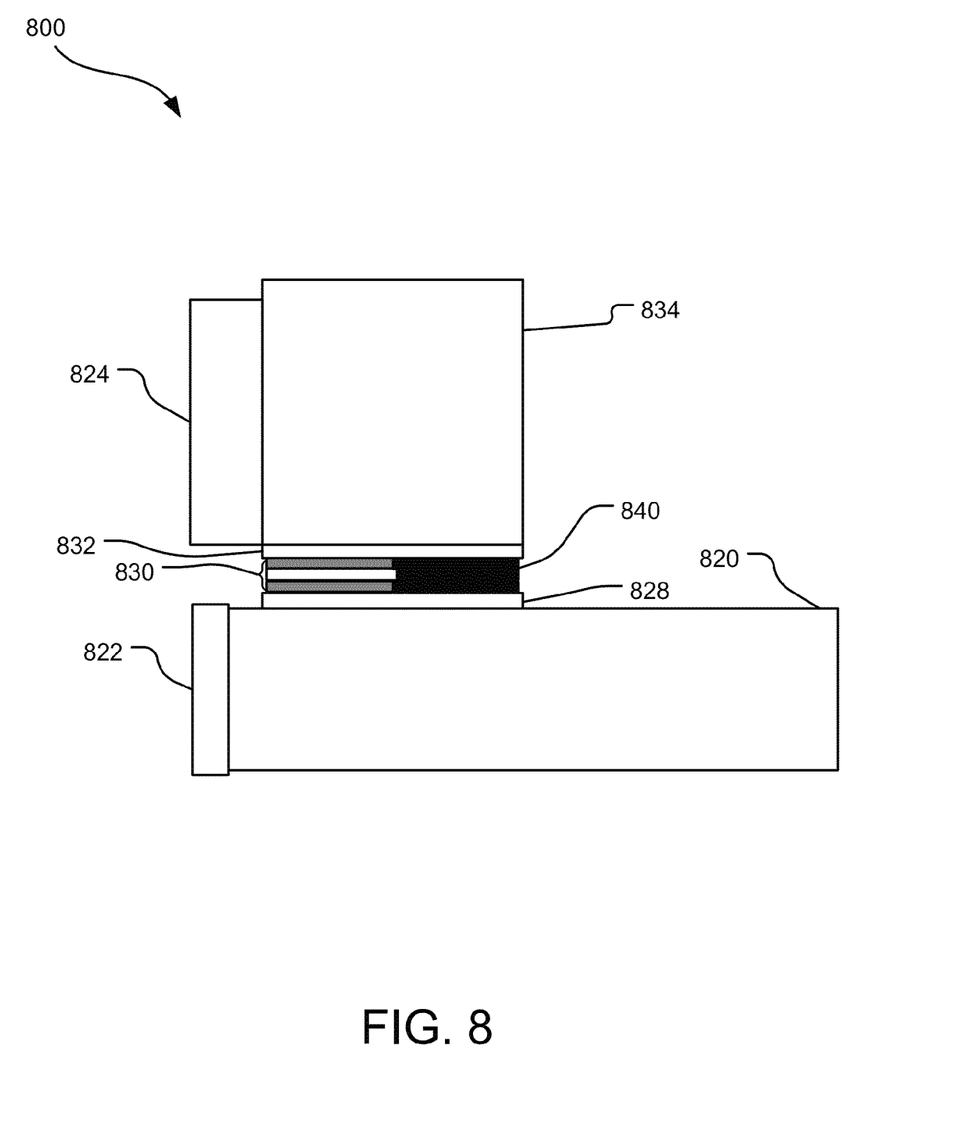
FIG. 8 illustrates an exothermic reaction step in attaching a first microelectronic component to a second microelectronic component according to one implementation.

FIG. 8 illustrates an exothermic reaction step 800 in attaching a first microelectronic component (e.g., a slider 820) to a second microelectronic component (e.g., a laser submount assembly 834) according to one implementation. Prior to the exothermic reaction step 800, energy was applied to a lamellar structure 830, which consists of at least two alternating thin film reactive layers positioned between first and second layers of solder 828 and 832.

In the exothermic reaction step 800, the energy applied to the lamellar structure 830 incites an exothermic reaction between the alternating thin film reactive layers. This reaction causes the alternating thin film reactive layers to start alloying together in a self-propagating way (as illustrated by a propagating alloy 840). Heat is rapidly produced at the interfaces between each of the alternating thin film reactive layers, which flows the solder layers 828 and 832. Depending on the materials chosen for the alternating thin film layers, the heated solder may or may not alloy with the alternating thin film layers. In one implementation, the heated solder encapsulates the alloyed multilayers and hardens to form a joint.

Figure 9:
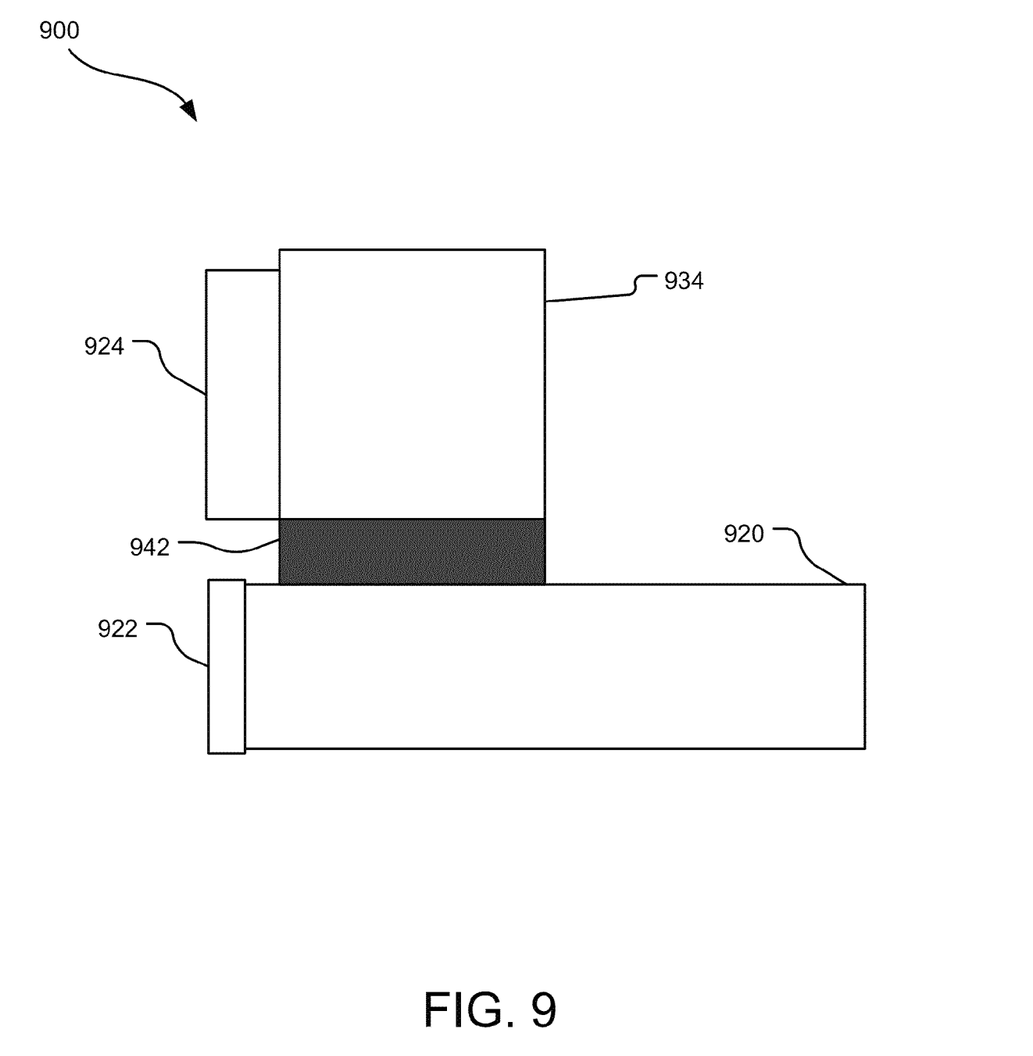
FIG. 9 illustrates an apparatus having a first microelectronic component attached to a second microelectronic component according to one implementation.

FIG. 9 illustrates an apparatus 900 having a first microelectronic component (e.g., a slider 920) attached to a second microelectronic component (e.g., a laser submount assembly 934) according to one implementation. To attach the first and second microelectronic components, energy was applied to a lamellar structure (not shown) consisting of alternating thin film reactive layers stacked in between the slider 920 and the laser submount assembly 934. The energy incited a self-propagating exothermic reaction that caused the alternating thin film reactive layers to alloy together throughout the lamellar structure (not shown). This reaction provided the heat necessary to melt at least one layer of solder adjacent to the lamellar structure.

The solder layer adjacent to the lamellar structure melted, encompassing the alloyed reactive layers in a joint 942 between the slider 920 and the laser submount assembly 934. In an implementation where no solder is used, the exothermic reaction effectively bonds the alloyed lamellar multilayer structure directly to the first and second microelectronic components.

There are several benefits to using implementations of the above-described exothermic process to create the joint 942. One such benefit is that the exothermic reaction between the reactive multilayers can create the joint 942 more quickly than traditional soldering. Using a traditional solder method, it can take several seconds for solder to be heated, reflowed, and cooled; however, in at least one implementation utilizing the exothermic process described herein, the joint 938 can be formed in a fraction of a second. Because the joint 942 can be formed in such a short period of time, the full effects of thermal expansion are not observed during the reaction. Therefore, the relative shift between the slider 920 and the laser submount assembly 934 between the time of alignment and the hardening of the joint 942 is significantly reduced as compared to the shift that occurs due to thermal expansion in a traditional solder attachment. This relative shift may vary according to the specific alloys utilized in the lamellar multilayer structure; however, in one implementation where aluminum and nickel are used, the relative shift is less than 300 nm. In other implementations, the aluminum and nickel maintain a substantial alignment that may be less than 100 nm.

Another benefit to using the above-described exothermic process is that the heat created by this type of reaction is localized, and thus does not impart a significant amount of thermal energy into the microelectronic components (e.g., the slider 920 and the laser submount assembly 934) or any tooling used in the attachment process. Therefore, the risk to heat-sensitive microelectronic components such as the laser is mitigated during this process as compared to traditional solder methods. Accordingly, a laser 924 on the laser submount assembly 934 may remain active during the solder reflow process, permitting confirmation of a final alignment with a waveguide 922 on the slider 920. Moreover, tooling utilized in an alignment and attachment process according to the steps described herein does not need to be impervious to high temperatures, thereby permitting for a broader selection of materials for the tooling.

Figure 10:
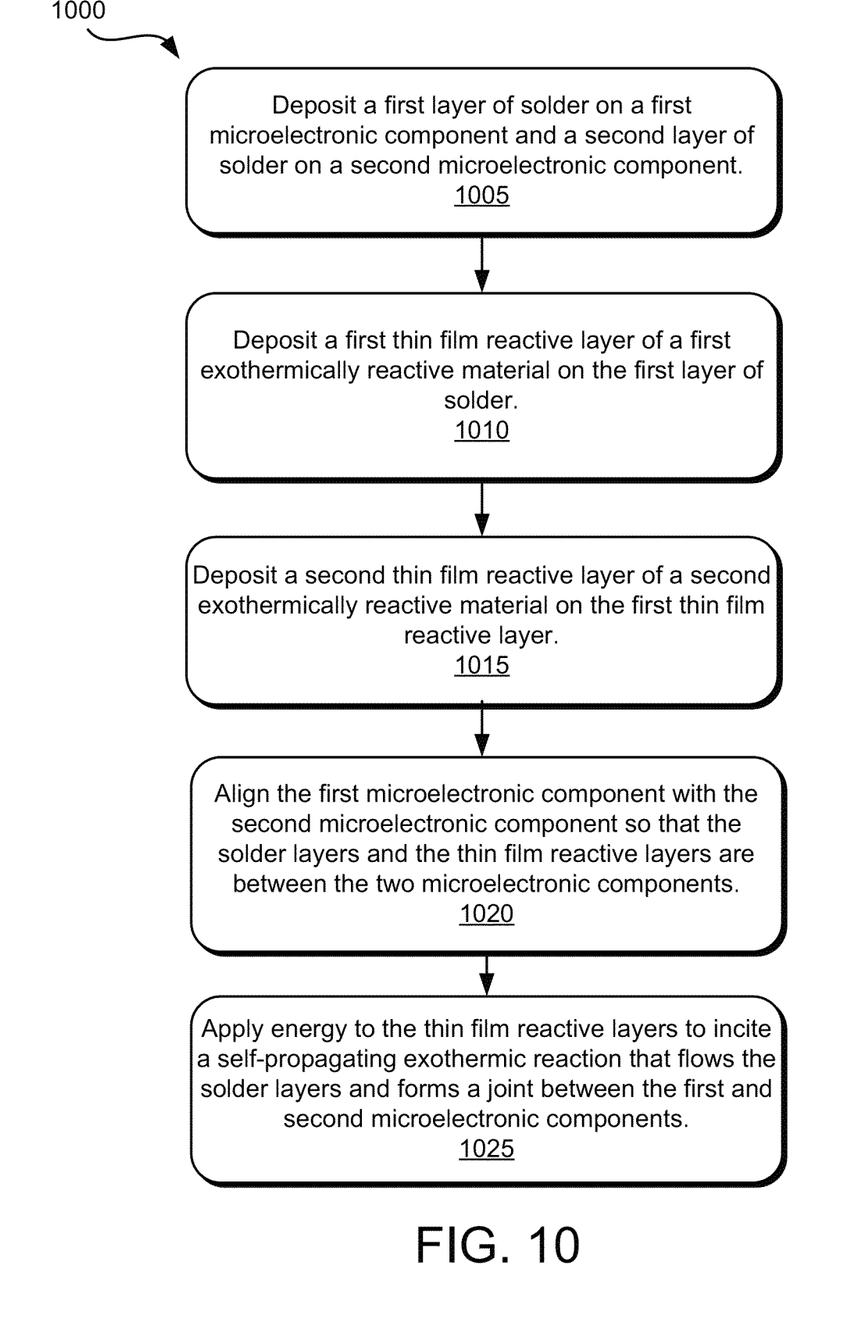
FIG. 10 illustrates example operations for attaching a first microelectronic component to a second microelectronic component according to one implementation.

FIG. 10 illustrates example operations for attaching a first microelectronic component to a second microelectronic component according to one implementation. A deposition operation 1005 deposits a first layer of solder on a first microelectronic component and a second layer of solder on a second microelectronic component. In one implementation, the first microelectronic component is a slider for use in a hard drive disc assembly and the second microelectronic component is a laser submount assembly to be attached to the slider. Alternatively, the slider could be the second microelectronic component and the laser submount assembly could be the first microelectronic component. The first and second microelectronic components may also any one of a number of other components that have sizes on the order of micrometers or smaller, such as micro-optical components and devices.

Although the solder layers may be formed on both of the first and second microelectronic devices as in deposition operation 1005 of FIG. 10, the solder layers may also be formed on other material layers (such as alternating thin film reactive layers) that are positioned between the first and second microelectronic devices when the energy is applied.

Some implementations include a single solder layer rather than two solder layers. In such an implementation, the single solder layer may be formed on either of the microelectronic components or on other layers (such as thin film reactive layers) such that the solder layer is between the first and second microelectronic components when energy is applied.

Another deposition operation 1010 deposits a first thin film layer of a first exothermically reactive material on top of the first layer of solder. The first thin film reactive layer may also be deposited directly on the second microelectronic component to be in contact with other thin film reactive layers and between the microelectronic components when the energy is applied.

Yet another deposition operation 1015 deposits a second thin film reactive layer of a second exothermically reactive material on the first thin film reactive layer. In alternate implementations, the second thin film layer may be deposited on insulator layers (such as solder layers) or directly on either of the microelectronic components such that second thin film reactive layer is adjacent to and in contact with the first thin film reactive layer when energy is applied.

The first and second exothermically reactive materials are preferably aluminum and nickel; however, a variety of other exothermically reactive materials may also be suitable. A number of additional alternating reactive thin film layers of the first and second exothermically reactive materials may be formed such that each thin film reactive layer of the first exothermically reactive material is in contact with a layer of the second exothermically reactive material when energy is applied.

An alignment operation 1020 aligns the first microelectronic component with the second microelectronic component for attachment such that the solder layers and the alternating thin film reactive layers are positioned between the first and second microelectronic components. The alignment operation 1020 may utilize additional components and/or tooling to position the first and second components relative to one another in a desired manner for attachment. In an implementation where the first microelectronic component is a slider and the second microelectronic component is a laser submount assembly, a laser on the submount assembly may be illuminated during the alignment, and the laser output through a waveguide on the slider may be monitored to guide the alignment.

An energy application operation 1025 applies energy to the alternating thin film reactive layers to incite a self-propagating exothermic reaction that melts the solder layers and forms a joint between the first and second microelectronic components. The energy may be applied for a short period of time, such as a fraction of a second and may be in the form of compression, a laser, a spark emission, etc. This energy causes the alternating thin film reactive layers to begin to alloy together, and the reaction self-propagates throughout the alternating thin film reactive layers. The heat from this reaction is localized such that it flows the layers of solder but does not harm the microelectronic components if they are sensitive to the temperatures of traditional solder (e.g., greater than 221 degrees Celsius for SnAg).

In one implementation, the exothermic reaction, solder reflow, and cooling period together span less than one second. In comparison, the heating/reflow/cooling cycle of traditional soldering can take several (e.g., approximately five) seconds. Therefore, the effects of thermal expansion on the joint and on the first and second components are significantly mitigated or not observed as compared to those observed in traditional soldering. Accordingly, a final alignment between the first and second components may be attained according to this exothermic process with submicron precision. In one implementation, the final alignment of the first and second microelectronic components differs from an original alignment (arrived at by the alignment operation 1020) by less than 300 nm.

It should be understood that operations referred to in the implementations disclosed herein may be performed in any order, adding and omitting as desired, unless explicitly claimed otherwise or a specific order is inherently necessitated by the claim language. The above specification, examples, and data provide a complete description of the structure and use of exemplary implementations of the invention. Since many implementations of the invention can be made without departing from the spirit and scope of the invention, the invention resides in the claims hereinafter appended. Furthermore, structural features of the different implementations may be combined in yet another implementations without departing from the recited claims.

What is claimed is:

1. A method comprising:
depositing a plurality of reactive thin film layers on a first microelectronic component;
aligning the first microelectronic component with a second microelectronic component;
applying energy to incite an exothermic reaction between the plurality of reactive thin film layers to form a joint between the first microelectronic component and the second microelectronic component, wherein a non-corrosive layer prevents contact between the plurality of reactive thin film layers and at least one of the first microelectronic component and the second microelectronic component when the energy is applied.

2. The method of claim 1, wherein at least one of the plurality of reactive thin film layers is in contact with the non-corrosive layer when the energy is applied and heat from the exothermic reaction melts the non-corrosive layer.

3. The method of claim 2, wherein the non-corrosive layer is in contact with a solder layer.

4. The method of claim 1, wherein the non-corrosive layer includes titanium.

5. The method of claim 1, wherein the plurality of reactive thin film layers are alternating layers of aluminum and nickel.

6. The method of claim 1, wherein the alignment of the first microelectronic component and the second microelectronic shifts by less than 300 nanometers when the joint is formed.

7. The method of claim 1, wherein the plurality of reactive thin film layers are evaporated onto a substrate.

8. The method of claim 1, wherein the joint is formed in less than one second when the energy is applied.

9. An apparatus comprising:
a first microelectronic component to be aligned with a second microelectronic component;
a plurality of reactive thin film layers formed on at least one of the first microelectronic component and the second microelectronic component, the plurality including:
a first reactive thin film layer deposited on the first microelectronic component;
at least one other reactive thin film layer to exothermically react with the first reactive thin film layer when energy is applied to form a joint between the first and second microelectronic components; and
a non-corrosive layer preventing contact between the plurality of reactive thin film layers and the first microelectronic component.

10. The apparatus of claim 9, wherein at least one of the plurality of reactive thin film layers is in contact with the non-corrosive layer when the energy is applied and heat from an exothermic reaction melts the non-corrosive layer.

11. The apparatus of 10, wherein the non-corrosive layer is in contact with a solder layer.

12. The apparatus of claim 9, wherein the non-corrosive layer includes titanium.

13. The apparatus of claim 9, wherein the plurality of reactive thin film layers are alternating layers of nickel and aluminum.

14. The apparatus of claim 9, wherein an alignment of the first microelectronic component and the second microelectronic component shifts by less than 300 nanometers when the joint is formed.

15. The apparatus of claim 9, wherein the joint is formed in less than one second when the energy is applied.

16. A system comprising:
a slider to be aligned with and bonded to a laser submount assembly;
a plurality of reactive thin film layers, the plurality including:
a first reactive thin film layer deposited on at least one of the slider or the laser submount assembly;
a second reactive thin film layer to exothermically react with the first reactive thin film layer when energy is applied to form a joint between the slider and the laser submount assembly;
a first protective layer preventing the laser submount assembly from direct contact with the plurality of reactive thin film layers; and
a second protective layer preventing the slider from direct contact with the plurality of reactive thin film layers.

17. The system of claim 16, wherein at least one of the first protective layer and the second protective layer is a non-corrosive layer.

18. The system of claim 17, wherein at least one of the first protective layer and the second protective layer is a solder layer.

19. The system of claim 16, wherein an alignment of the first microelectronic component and the second microelectronic component shifts by less than 300 nanometers when the joint is formed.

20. The system of claim 16, wherein the joint is formed in less than one second when the energy is applied.

* * * * *